(12) United States Patent
Miyabe

(10) Patent No.: US 10,388,299 B2
(45) Date of Patent: Aug. 20, 2019

(54) HOWLING SUPPRESSION DEVICE

(71) Applicant: Asahi Kasei Microdevices Corporation, Tokyo (JP)

(72) Inventor: Masashi Miyabe, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 0 days.

(21) Appl. No.: 15/911,169

(22) Filed: Mar. 5, 2018

(65) Prior Publication Data

US 2018/0211681 A1   Jul. 26, 2018

Related U.S. Application Data

(63) Continuation of application No. PCT/JP2016/078318, filed on Sep. 26, 2016.

(30) Foreign Application Priority Data

Sep. 28, 2015 (JP) .................. 2015-189685

(51) Int. Cl.
| | |
|---|---|
| *H03G 3/30* | (2006.01) |
| *H04R 3/02* | (2006.01) |
| *H04R 3/04* | (2006.01) |
| *G10L 21/0232* | (2013.01) |

(52) U.S. Cl.
CPC ....... *G10L 21/0232* (2013.01); *H03G 3/3005* (2013.01); *H04R 3/02* (2013.01); *H04R 3/04* (2013.01); *H04R 2430/03* (2013.01)

(58) Field of Classification Search
None
See application file for complete search history.

(56) References Cited

U.S. PATENT DOCUMENTS

| | | | |
|---|---|---|---|
| 5,983,139 A | 11/1999 | Zierhofer | |
| 2006/0098827 A1* | 5/2006 | Paddock | ............... G10L 21/02 381/106 |
| 2010/0239104 A1* | 9/2010 | Iser | .................... G10L 21/0208 381/94.2 |
| 2011/0200200 A1* | 8/2011 | Avayu | ................. G10L 21/0208 381/58 |

FOREIGN PATENT DOCUMENTS

| | | |
|---|---|---|
| JP | S49-90006 | 8/1974 |
| JP | 2007-043512 A | 2/2007 |
| JP | 2010-166477 A | 7/2010 |

OTHER PUBLICATIONS

International Search Report for International Patent Application No. PCT/JP2016/078318, issued by the Japan Patent Office dated Dec. 6, 2016.

\* cited by examiner

*Primary Examiner* — Curtis A Kuntz
*Assistant Examiner* — Kenny H Truong

(57) ABSTRACT

A howling suppression device is provided, including: a plurality of filters in which a passband and a stopband are arranged alternately on a frequency axis; and a gain control unit which temporally varies an output gain of each of the plurality of filters and sums signals thus varied to output, wherein each of the plurality of filters has a passband in at least part of a stopband of another filter.

16 Claims, 13 Drawing Sheets

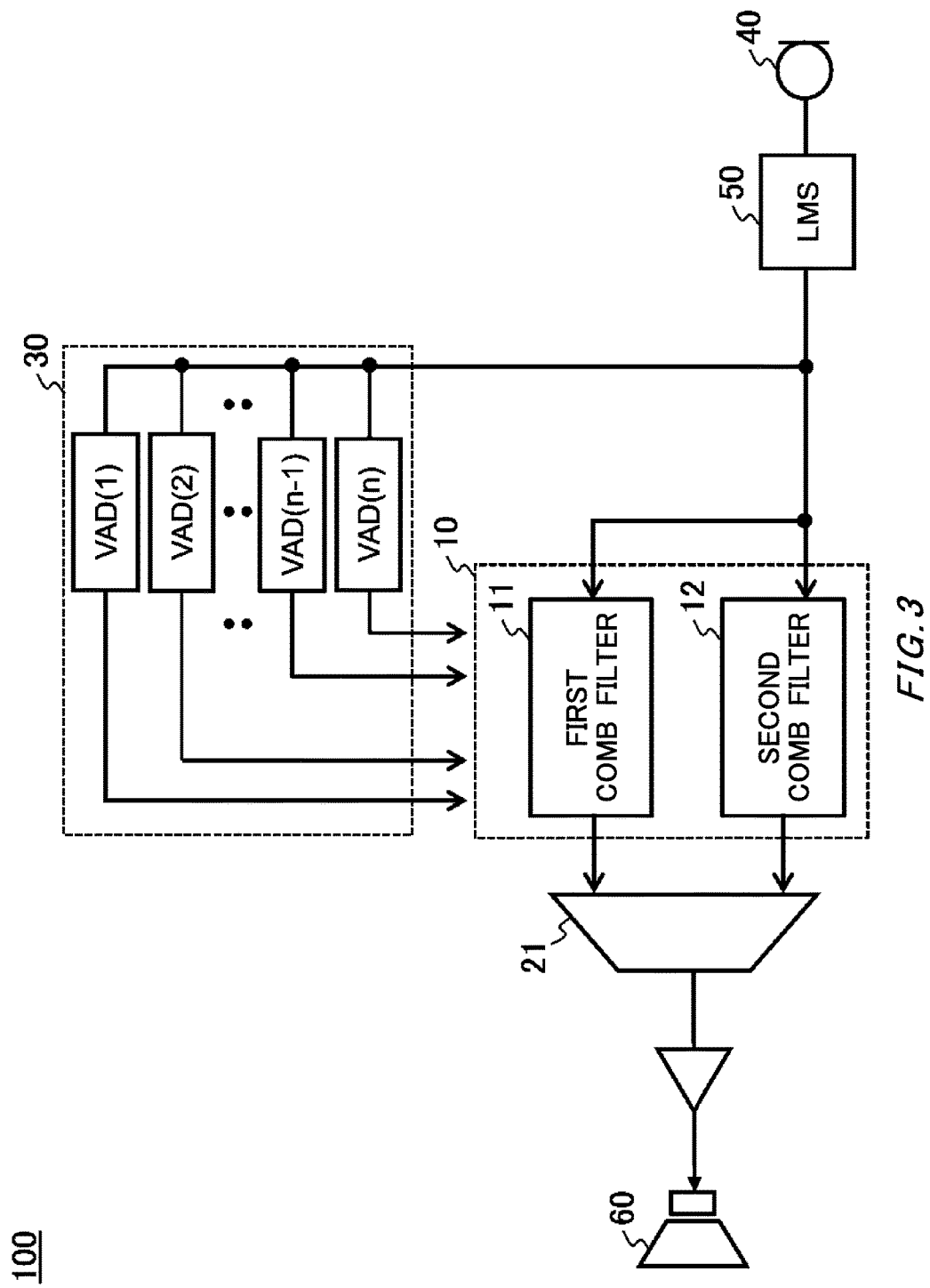

HOWLING SUPPRESSION DEVICE

The contents of the following Japanese patent applications are incorporated herein by reference:
NO. 2015-189685 filed in JP on Sep. 28, 2015, and
NO. PCT/JP2016/078318 filed on Sep. 26, 2016.

BACKGROUND

1. Technical Field

The present invention relates to a howling suppression device.

2. Related Art

Conventionally, a technique has been known to prevent howling by detecting a center frequency of occurring howling with a howling prevention device for suppressing occurrence of howling (see Patent Document 1, for example).

Patent Document 1: Japanese Patent Application Publication No. 2010-166477

However, the conventional howling prevention device identifies a howling frequency and starts an attenuation operation only after howling occurs. For that reason, in the case of howling which increases abruptly and significantly, a listener may hear a discomfort sound.

SUMMARY

A first aspect of the present invention provides a howling suppression device, including: a plurality of filters in which a passband and a stopband are arranged alternately on a frequency axis; and a gain control unit which temporally varies an output gain of each of the plurality of filters and sums signals thus varied to output, wherein each of the plurality of filters has a passband in at least part of a stopband of another filter.

The summary clause does not necessarily describe all necessary features of the embodiments of the present invention. The present invention may also be a sub-combination of the features described above.

BRIEF DESCRIPTION OF THE DRAWINGS

FIG. 3 shows a configuration example of the howling suppression device 100 according to an example embodiment 1.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

Figure 1:
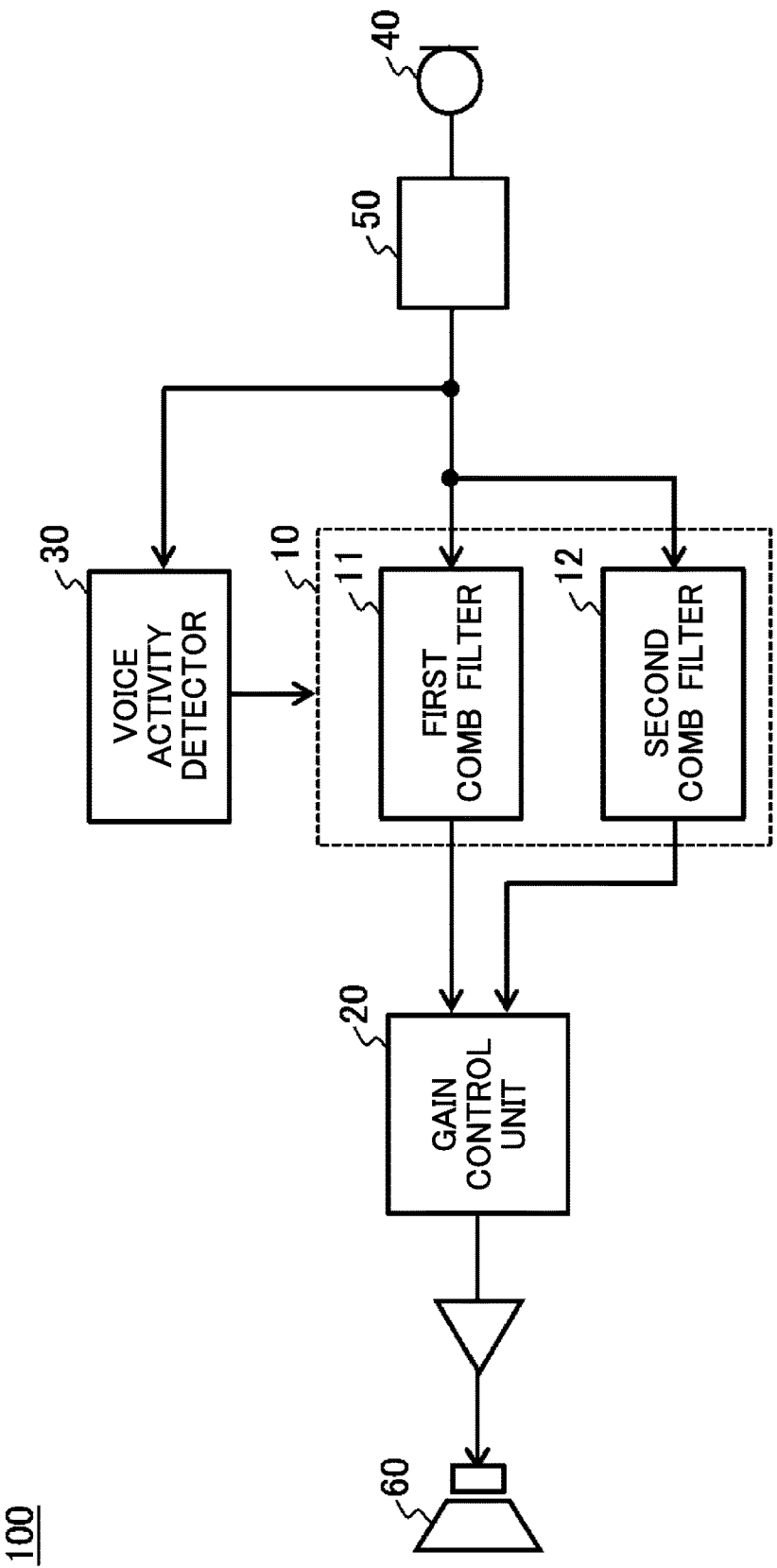
FIG. 1 shows an overview of the configuration of a howling suppression device 100.

FIG. 1 shows an overview of the configuration of a howling suppression device 100. The howling suppression device 100 includes a comb filter 10, a gain control unit 20, a voice activity detector 30, a microphone 40, an adaptive filter 50 and a speaker 60. Note that the microphone 40, the adaptive filter 50 and the speaker 60 may be provided outside the howling suppression device 100.

The howling suppression device 100 suppresses occurrence or increase of howling corresponding to an input sound signal. The howling suppression device 100 of the present example amplifies a sound signal detected by the microphone 40 with a predetermined gain. Also, the howling suppression device 100 outputs the amplified sound signal from the speaker 60.

The comb filter 10 performs filtering on the sound signal detected by the microphone 40 in order to suppress occurrence and increase of howling. The comb filter 10 performs the filtering to attenuate a sound signal of a predetermined frequency band by a predetermined attenuation amount. The comb filter 10 includes a plurality of filters. The comb filter 10 of the present example includes a first comb filter 11 and a second comb filter 12.

The first comb filter 11 attenuates a sound signal of a predetermined frequency band by a predetermined attenuation amount. The first comb filter 11 has passbands and stopbands arranged alternately on a frequency axis. A passband refers to a frequency band through which an input sound signal passes without being attenuated. A stopband refers to a frequency band in which an input sound signal is attenuated by a predetermined attenuation amount. Note that a passband is not limited to a band in which a sound signal is not attenuated at all, but may be a band in which a sound signal is attenuated by a smaller attenuation amount than a predetermined value.

The second comb filter 12 attenuates a sound signal of a predetermined frequency band by a predetermined attenuation amount. The second comb filter 12 has passbands and stopbands arranged alternately on the frequency axis. The passbands of the second comb filter 12 are set to frequency bands different from the passbands of the first comb filter 11. Also, the stopbands of the second comb filter 12 may be set to frequency bands different from the stopbands of the first comb filter 11. That is, it is at least required that the passbands of the first comb filter 11 and the second comb filter 12 are not set to the same frequency bands. It is preferable that the first comb filter 11 and the second comb filter 12 are configured such that the respective stopbands and passbands mate with each other.

In this specification, the expression "the stopbands and passbands of the comb filter 10 mate with each other" means that the passbands of the first comb filter 11 are frequency bands equal to the stopbands of the second comb filter 12, and the stopbands of the first comb filter 11 are frequency bands equal to the passbands of the second comb filter 12. It is preferable that the comb filter 10 has stopbands and passbands mating in the entire frequency band, but the stopbands and passbands may mate only in a frequency band where howling is likely to occur. For example, each of the plurality of filters included in the comb filter 10 has its passbands in at least part of the stopbands of another filter.

The gain control unit 20 temporally varies the output gain of each of the plurality of filters included in the comb filter 10, and sums the signals thus varied to output. The gain control unit 20 of the present example temporally varies the gains of the first comb filter 11 and the second comb filter 12. Temporally varying means varying a first output gain of the first comb filter 11 and a second output gain of the second comb filter 12 at a predetermined period. For example, the gain control unit 20 is a selector or a variable adder. If the gain control unit 20 is a selector, the gain control unit 20 interchanges the first output gain of the first comb filter 11 and the second output gain of the second comb filter 12 alternately at a predetermined period. Also, if the gain control unit 20 is a variable adder, the gain control unit 20 varies the first output gain of the first comb filter 11 and the second output gain of the second comb filter 12 using respective functions with different phase. Note that summing to output by the gain control unit 20 includes both outputting a signal selected by a selector and outputting a signal summed by a variable adder.

The voice activity detector 30 detects a predetermined sound signal in any frequency band. For example, the voice activity detector 30 has a voice activity detector VAD for each frequency band, and detects a sound signal relating to speech of a living body. Speech of a living body is detected based on whether variation of a detected sound signal is stationary or non-stationary. If a detected sound signal is non-stationary, the voice activity detector 30 determines that the sound signal is speech of a living body. On the other hand, if a detected sound signal is stationary, the voice activity detector 30 determines that the sound signal is not speech of a living body.

The word "stationary" means that there is no temporal variation in the amplitude of sound, or there is a smaller amount of such variation than a predetermined threshold. On the other hand, the word "non-stationary" means that there is temporal variation in the amplitude of sound, or there is a larger amount of such variation than a predetermined threshold. However, the voice activity detector 30 may change the threshold for detecting speech as appropriate in accordance with the environment where the howling suppression device 100 is used or the like. Note that, although this specification describes the case where the voice activity detector 30 detects speech of a living body, the voice activity detector 30 may be set to detect a predetermined sound signal other than speech of a living body.

The microphone 40 converts an input sound into an electrical sound signal. The microphone 40 may be directed toward a living body so as to detect speech of the living body. In the case of detecting speech of a living body, it is preferable to shorten the distance between the microphone 40 and the living body for less attenuation of the speech.

The adaptive filter 50 filters a sound signal detected at the microphone 40. The adaptive filter 50 may be a typical adaptive filter circuit. For example, the adaptive filter 50 is configured of an adaptive filter circuit which utilizes the least mean square (LMS). The howling suppression device 100 can obtain a higher howling tolerance by using the adaptive filter 50.

The speaker 60 converts a sound signal output from the gain control unit 20 into sound (sound wave). The sound signal output from the gain control unit 20 may be input to the speaker 60 through a buffer or the like. The speaker 60 outputs the converted sound wave to the outside. For example, the speaker 60 outputs the converted sound wave to a living body as its listener.

Here, for a typical sound transmission device, if the distance between the microphone 40 and the speaker 60 is short and the gain of a speaker amplifier is large, an acoustically closed circuit is formed through the microphone 40, the speaker amplifier, the speaker 60, space and the microphone 40 in this order. When the acoustically closed circuit is formed, acoustic coupling occurs. Here, if the acoustic coupling is of an amplification type, howling may be caused. Howling is a phenomenon where a sound of a particular frequency amplified in this manner increases exponentially to become a noise.

As described above, the howling suppression device 100 of the present example includes a first comb filter 11 and a second comb filter 12 in which their passbands and stopbands are arranged to mate with each other. Also, the howling suppression device 100 suppresses occurrence and increase of howling by temporally varying the output gains of the first comb filter 11 and the second comb filter 12.

Figure 2A:
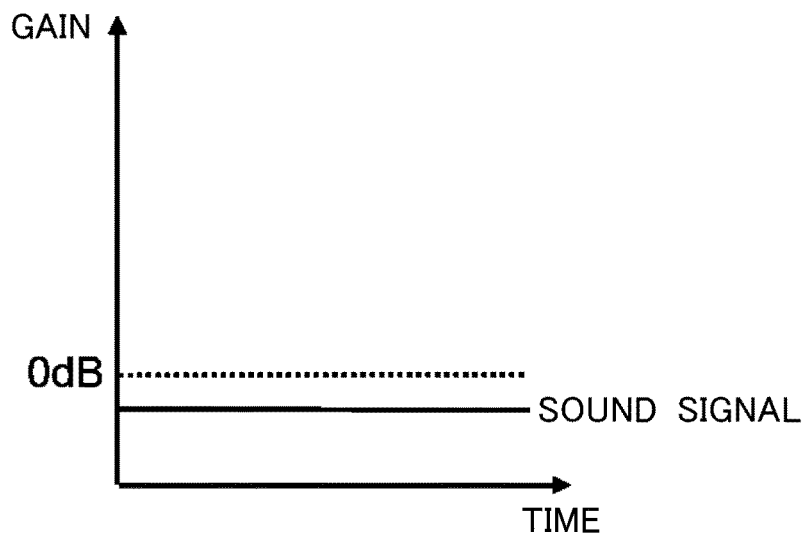
FIG. 2A shows temporal variation of a sound signal in an attenuation system.

FIG. 2A shows temporal variation of a sound signal in an attenuation system. If the system of the transmission device is an attenuation system, a sound signal is not amplified and howling does not occur.

Figure 2B:
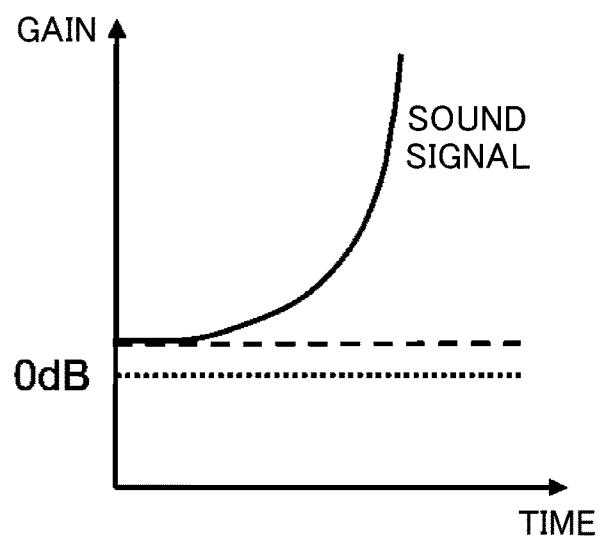
FIG. 2B shows temporal variation of a sound signal in an amplification system.

FIG. 2B shows temporal variation of a sound signal in an amplification system. If the system of the transmission device is an amplification system, a sound signal is amplified over time and howling increases exponentially. For example, if a conventional device is used, which detects the center frequency of howling and thereafter starts to suppress the howling, it is necessary to detect the howling frequency before starting to suppress the howling, and therefore howling which increases rapidly can not be suppressed.

Figure 2C:
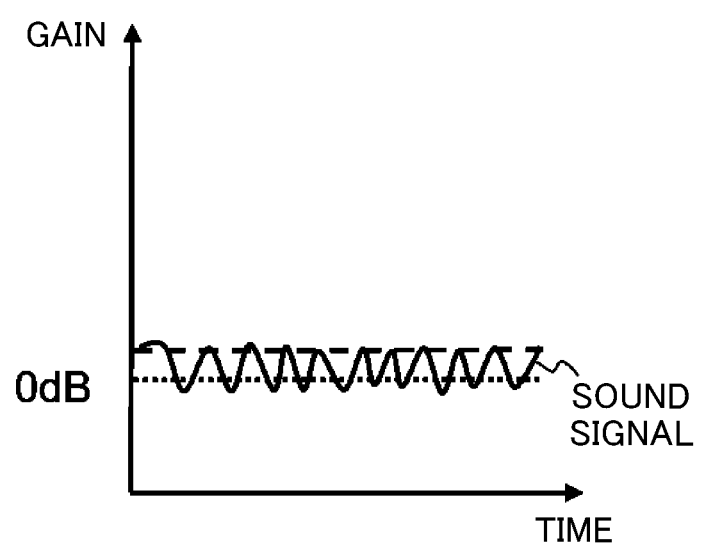
FIG. 2C shows temporal variation of a sound signal in the case of using the howling suppression device 100.

FIG. 2C shows temporal variation of a sound signal in the case of using the howling suppression device 100. The howling suppression device 100 of the present example temporally varies the output gain of a comb filter without detecting the center frequency of howling. For example, the howling suppression device 100 suppresses occurrence and increase of howling in advance by shortening the switching period of the output gains of the first comb filter 11 and the second comb filter 12. In this manner, the howling suppression device 100 of the present example can suppress howling without discomforting a listener even if the system of the transmission device is an amplification system.

Example Embodiment 1

FIG. 3 shows a configuration example of the howling suppression device 100 according to an example embodiment 1. The gain control unit 20 of the present example is configured of a selector 21.

The selector 21 selects an output from either the first comb filter 11 or the second comb filter 12. That is, the selector 21 alternately switches a first state in which the first output gain is set to 1 and the second output gain is set to 0 and a second state in which the first output gain is set to 0 and the second output gain is set to 1. In this manner, the selector 21 selects a sound signal through either the first comb filter 11 or the second comb filter 12. The selector 21 switches the first comb filter 11 and the second comb filter 12 at equal intervals in the present example, but it may switch them at different periods.

The voice activity detector 30 detects a predetermined sound signal in each of n divided frequency bands Band(1) to Band(n). The voice activity detector 30 of the present example has n voice activity detectors VAD(1) to VAD(n). The n voice activity detectors VAD(1) to VAD(n) detect speech in the n corresponding frequency bands. The n voice activity detectors VAD(1) to VAD(n) adjust the output gains of the first comb filter 11 and the second comb filter 12 in accordance with detected speech.

Figure 4:
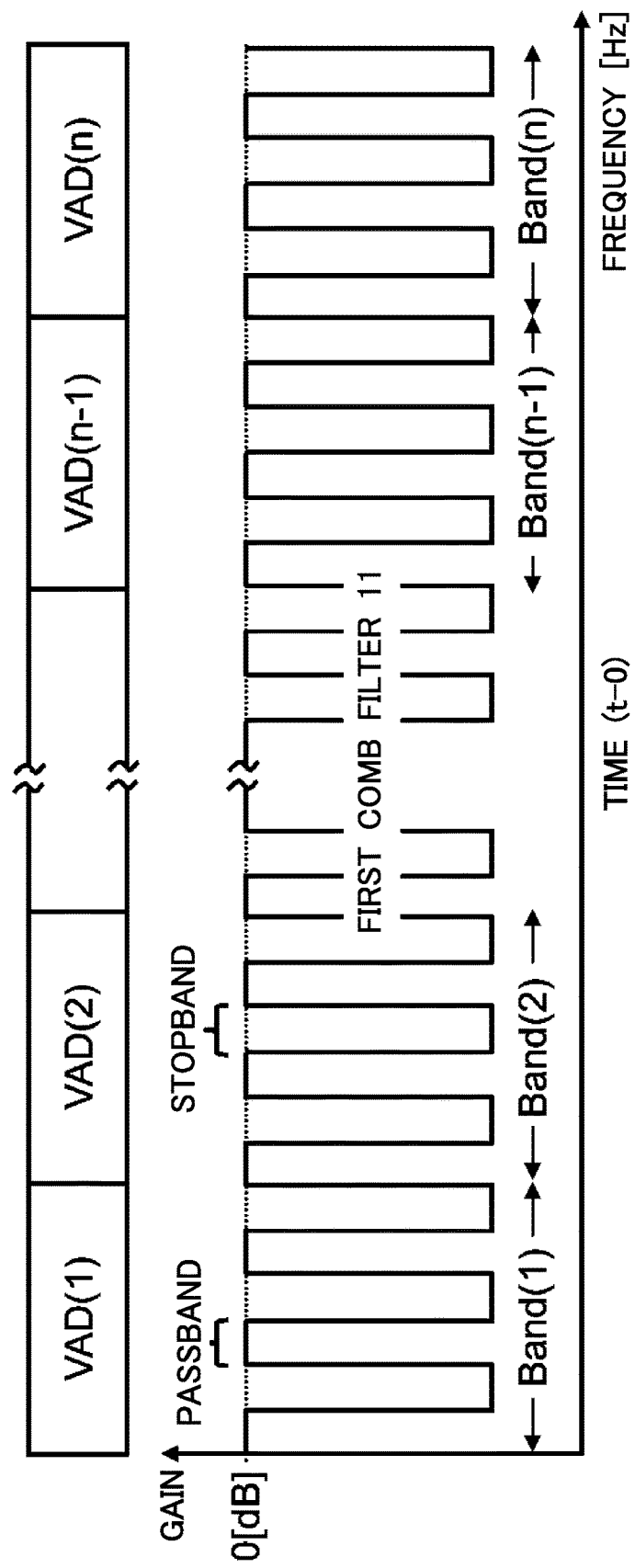
FIG. 4 shows an example of a first comb filter 11 according to the example embodiment 1.

FIG. 4 shows an example of the first comb filter 11 according to the example embodiment 1. The vertical axis indicates gain [dB], and the horizontal axis indicates frequency [Hz]. The present example shows the case where the first comb filter 11 is applied at time (t−0). Gain on the vertical axis indicates the attenuation amount of a sound signal input to the first comb filter 11. That is, a sound signal is not attenuated in a passband with a gain of 0 [dB]. On the other hand, in a stopband with a gain of smaller than 0 [dB], a sound signal is attenuated by an attenuation amount according to each gain.

The first comb filter 11 has passbands and stopbands arranged alternately on the frequency axis. In the present example, the stopbands have a uniform gain in the entire frequency band. On the other hand, the passbands have a uniform gain of 0 [dB] in the entire frequency band.

Figure 5:
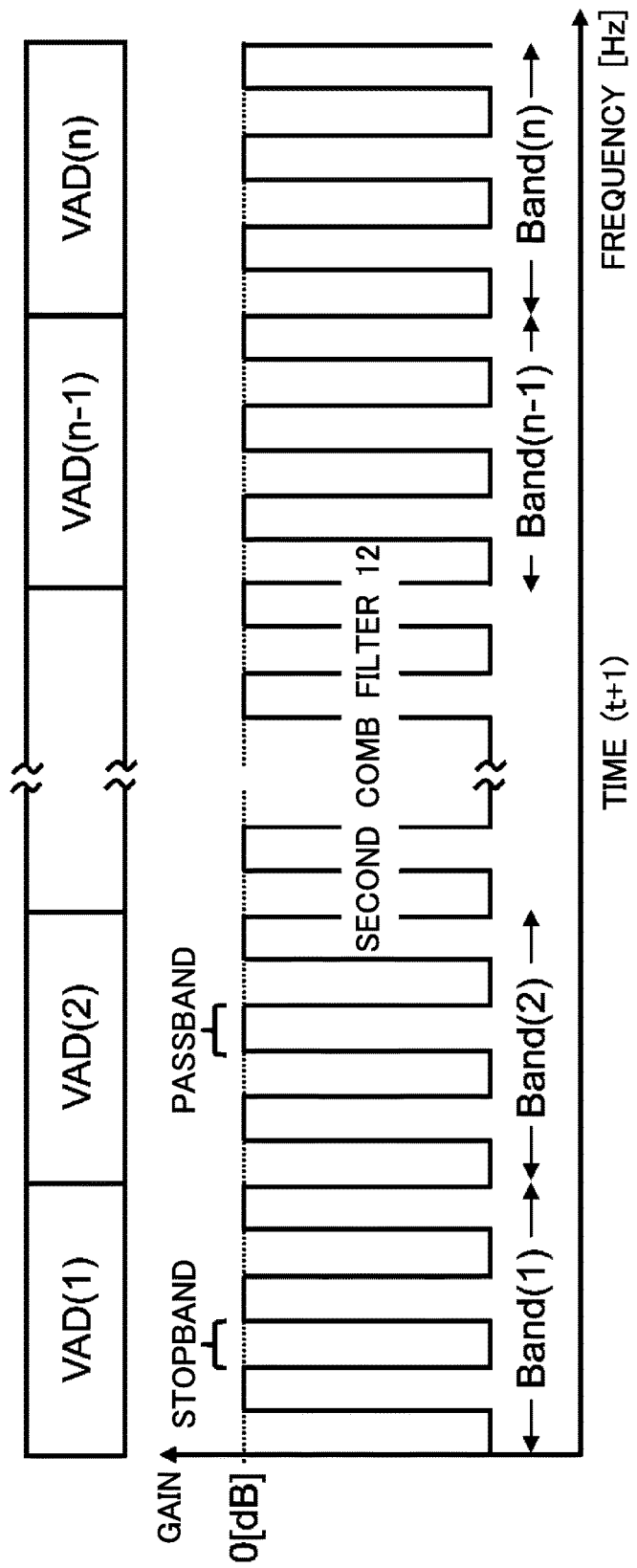
FIG. 5 shows an example of a second comb filter 12 according to the example embodiment 1.

FIG. 5 shows an example of the second comb filter 12 according to the example embodiment 1. The vertical axis indicates gain [dB], and the horizontal axis indicates frequency [Hz]. The present example shows the case where the second comb filter 12 is applied at time (t+1).

The second comb filter 12 has passbands and stopbands arranged alternately on the frequency axis. The stopbands of the second comb filter 12 have a uniform gain in the entire frequency band in a manner similar to the stopbands of the first comb filter 11. However, the stopbands of the second comb filter 12 is arranged in a staggered manner with the stopbands of the first comb filter 11.

In this manner, the first comb filter 11 is applied at time (t−0), and the second comb filter 12 is applied at subsequent time (t+1). Also, the gain control unit 20 repeats operations of time (t−0) and time (t+1). In this manner, the stopbands and the passbands are repeated in the entire frequency band. Accordingly, even if howling begins to increase, the stopbands of at least either comb filter are applied. When the howling is subsequently suppressed, passbands are applied again.

Meanwhile, adjacent frequency bands have inverse cycles of repetition of stopbands and passbands. Accordingly, when a sound signal of a certain frequency band is attenuated, attenuation of a sound signal of an adjacent frequency band is reduced. A sound signal input to the comb filter 10 is complemented by adjacent frequency bands, and therefore vibration feeling of the sound becomes less prone to be perceived. Accordingly, the howling suppression device 100 can convey speech naturally to a listener while suppressing howling.

The width of each band of a comb filter is not limited in its magnitude, and is set to an appropriate frequency band width. For example, for the comb filter 10, the vibration feeling can be made less prone to be perceived by reducing the width of each band of the comb filters. However, for the comb filter 10, it is preferable to set the widths of the respective bands of the first comb filter 11 and the second comb filter 12 to be equal to each other.

The switching period of the comb filters is set to an appropriate period in accordance with the configuration of the system. The gain control unit 20 can make the switching period of the comb filters relatively short so as to shorten the time required to suppress increase of howling. Also, the gain control unit 20 can make the switching period of the comb filters relatively long so as to reduce the vibration feeling and thereby output a more natural sound. In this manner, the gain control unit 20 may set the switching period of the comb filters to an appropriate magnitude in accordance with the environment where the howling suppression device 100 is installed or the like. For example, the gain control unit 20 switches the first comb filter 11 and the second comb filter 12 at a period of 2 ms or more and 100 ms or less. The switching period of the comb filters may be 10 ms or more and 50 ms or less, or 20 ms or more and 40 ms or less.

As described above, the howling suppression device 100 of the present example temporally varies the output gains of the first comb filter 11 and the second comb filter 12, in which their passbands and stopbands are arranged to mate with each other. In this manner, a stopband is applied at a predetermined period in any frequency band. That is, there is no frequency band where a stopband is not applied in the entire frequency band, and therefore a sound signal is necessarily attenuated by a predetermined attenuation amount. Accordingly, the howling suppression device 100 of the present example can suppress occurrence and increase of howling in the entire frequency band.

Also, by arranging the comb filter 10 which supports the entire frequency band where howling may occur, the howling suppression device 100 can be used even if it is difficult to identify frequencies in which howling occurs. Furthermore, since it is not necessary to detect the howling frequency in advance, the howling suppression device 100 can suppress howling quickly before the howling increases even if the howling increases abruptly.

Example Embodiment 2

Figure 6:
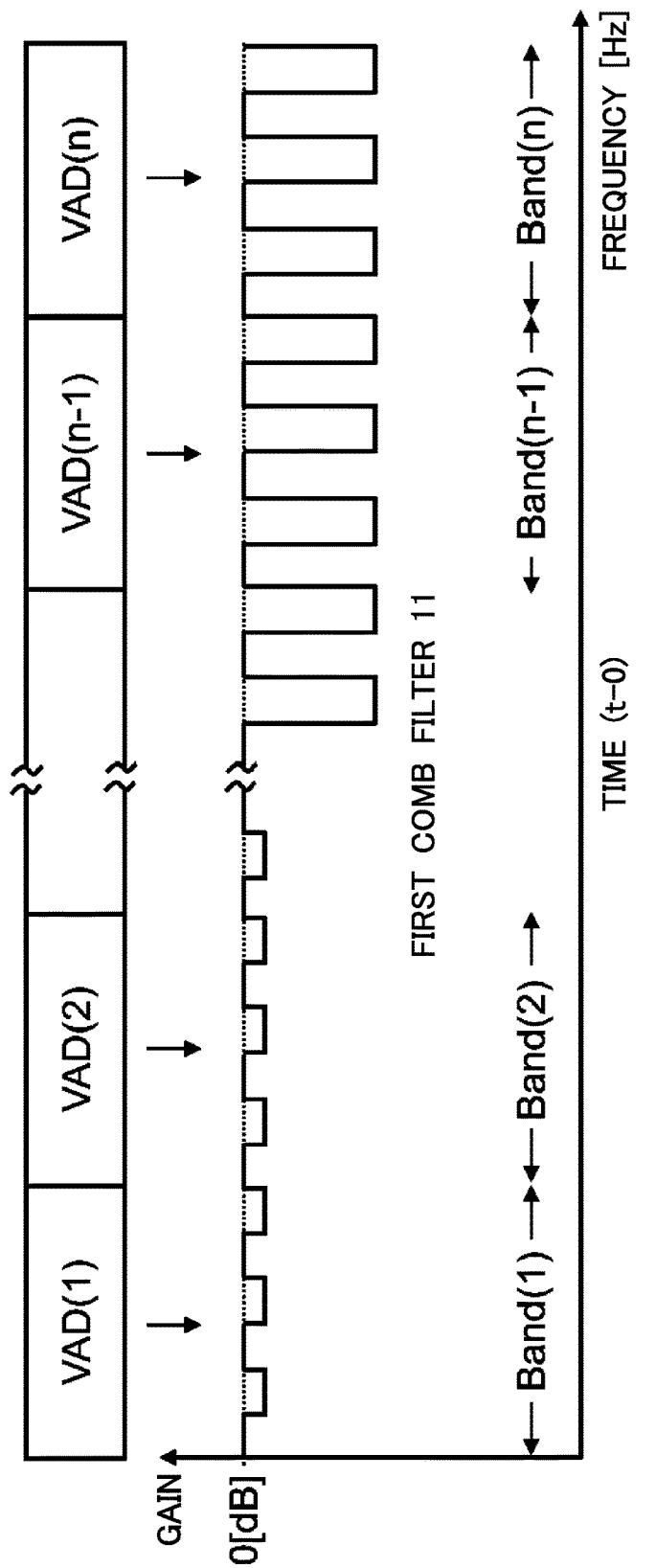
FIG. 6 shows an example of the first comb filter 11 according to an example embodiment 2.

FIG. 6 shows an example of the first comb filter 11 according to an example embodiment 2. The vertical axis indicates gain [dB], and the horizontal axis indicates frequency [Hz]. The present example shows the case where the first comb filter 11 is applied at time (t−0). The howling suppression device 100 of the present example detects speech and reduces the attenuation amount in a frequency band corresponding to the voice print of living body.

The voice activity detector 30 of the present example adjusts the attenuation amount for the $m_a$-th ($m_a$ is an integer of 1 or more and n or less) adjustment band on the frequency axis, Band($m_a$), based on a sound signal detected at the $m_d$-th ($m_d$ is an integer of 1 or more and n or less) voice activity detector on the frequency axis, VAD($m_d$). In this specification, an act of selecting an adjustment band Band ($m_a$) corresponding to any detection band Band($m_d$) is referred to as pairing. In the present example, a detection band Band($m_d$) and an adjustment band Band($m_a$) that are frequency bands equal to each other are paired.

A detection band Band($m_d$) represents a frequency band that is any of the frequency bands Band(1) to Band(n) in which speech is detected. Also, an adjustment band Band ($m_a$) represents a frequency band that is any of the frequency bands Band(1) to Band(n) in which the attenuation amount of the comb filter 10 is adjusted. In the present example, $m_d$ and $m_a$ each represent any integer of 1 or more and n or less.

The first comb filter 11 has passbands and stopbands arranged alternately on the frequency axis, in a manner similar to the example embodiment 1. In the present example, the stopbands have different attenuation amounts in accordance with their frequency bands. For example, the voice activity detector 30 reduces the attenuation amount for the stopbands in a relatively low-frequency band corresponding to the voice print. On the other hand, the voice activity detector 30 sets the attenuation amount for the stopbands to the same magnitude as the example embodiment 1 in a relatively high-frequency band other than the voice print. Also, the passbands of the first comb filter 11 have a constant gain of 0 [dB] in the entire frequency band.

In the present example, a detection band Band($m_d$) and an adjustment band Band($m_a$) are equal, and therefore the m-th (m is an integer of 1 or more and n or less) voice activity detector on the frequency axis, VAD(m), detects speech in the m-th frequency band on the frequency axis, Band(m), and adjusts the attenuation amount for Band(m).

More specifically, the voice activity detector VAD(1) determines whether speech occurs or not from temporal variation in the amplitude of sound for a frequency component included in Band(1). When speech is detected, the voice activity detector VAD(1) adjusts the attenuation amount for Band(1). Here, Band(1) is a frequency band corresponding to the voice print, and therefore the voice activity detector VAD(1) reduces the attenuation amount for Band(1). Similarly, the voice activity detector VAD(2) determines whether speech occurs or not from temporal variation in the amplitude of sound for a frequency component included in Band(2). When speech is detected, the voice activity detector VAD(2) adjusts the attenuation amount for Band(2). Here, Band(2) is a frequency band corresponding to the voice print, and therefore the voice activity detector VAD(2) reduces the attenuation amount for Band(2).

On the other hand, the voice activity detector VAD(n) determines whether speech occurs or not from temporal variation in the amplitude of sound for a frequency component included in Band(n). When speech is detected, the voice activity detector VAD(n) adjusts the attenuation amount for Band(n). However, Band(n) is different from the frequency band of the voice print, and therefore the voice activity detector VAD(n) does not reduce the attenuation amount for Band(n). Similarly, the voice activity detector VAD(n−1) determines whether speech occurs or not from temporal variation in the amplitude of sound for a frequency component included in Band(n−1). When speech is detected, the voice activity detector VAD(n−1) adjusts the attenuation amount for Band(n−1). However, Band(n−1) is different from the frequency band of the voice print, and therefore the voice activity detector VAD(n−1) does not reduce the attenuation amount for Band(n−1).

Figure 7:
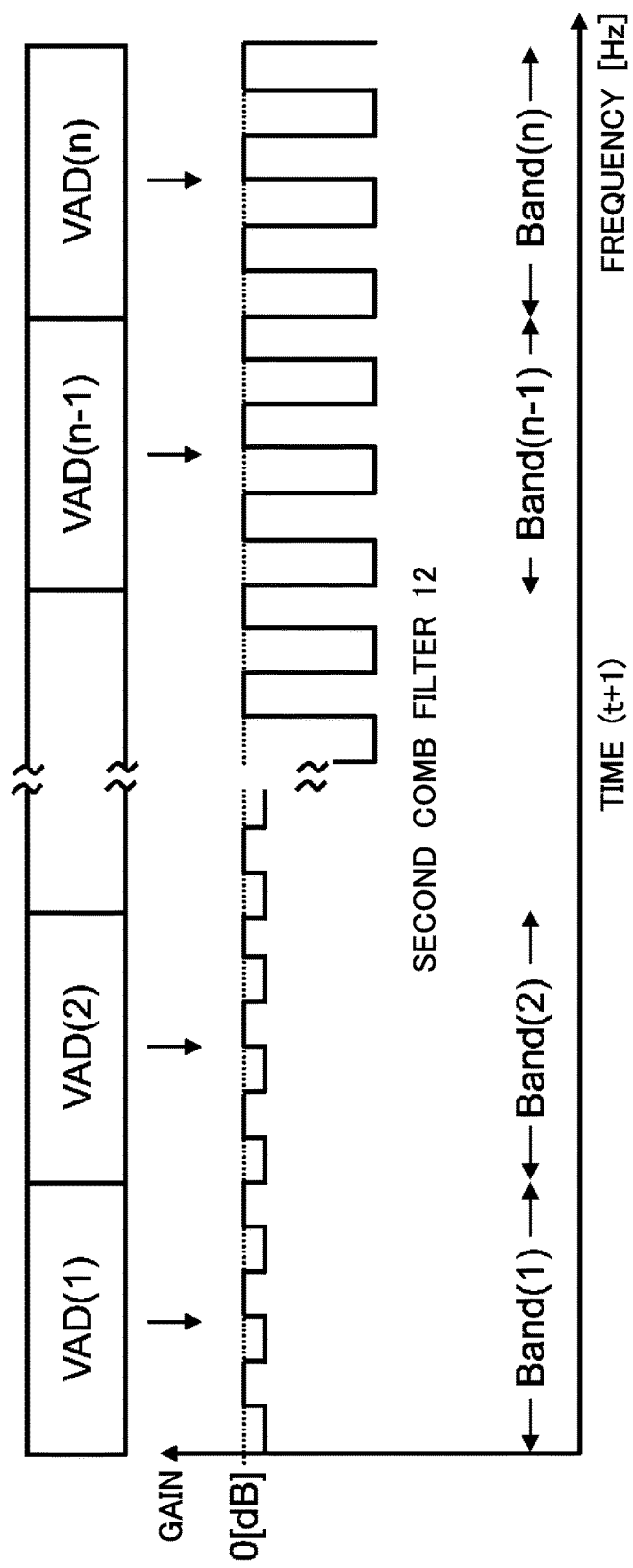
FIG. 7 shows an example of the second comb filter 12 according to the example embodiment 2.

FIG. 7 shows an example of the second comb filter 12 according to the example embodiment 2. The vertical axis indicates gain [dB], and the horizontal axis indicates frequency [Hz]. The present example shows the case where the second comb filter 12 is applied at time (t+1).

In a manner similar to the first comb filter 11 according to the example embodiment 2, the voice activity detector 30 determines whether or not to reduce the attenuation amount of the second comb filter 12 in accordance with whether an adjustment band Band($m_a$) corresponds to the voice print or not when speech is detected. For example, if the adjustment band Band($m_a$) is a relatively low-frequency band corresponding to the voice print, the voice activity detector 30 reduces the attenuation amount for the stopbands. On the other hand, if the adjustment band Band($m_a$) is a relatively high-frequency band other than the voice print, the voice activity detector 30 does not reduce the attenuation amount for the stopbands. However, the voice activity detector 30 arranges the passbands and stopbands in a staggered manner such that the first comb filter 11 and the second comb filter 12 mate with each other, in a manner similar to the example embodiment 1. Also, the passbands of the second comb filter 12 are set to have a uniform gain of 0 [dB] in the entire frequency band.

The attenuation amount of the second comb filter 12 may be the same as or different from the attenuation amount of the first comb filter 11. However, it is preferable that the attenuation amount of the first comb filter 11 and the attenuation amount of the second comb filter 12 are the same so that discomfort to the listener is reduced. Note that the attenuation amount of the first comb filter 11 and the attenuation amount of the second comb filter 12 may be varied for each frequency band.

As described above, the howling suppression device 100 of the present example reduces the attenuation amount in a frequency band corresponding to the voice print of a living body, and therefore discomfort to the listener can be reduced. That is, by reducing the attenuation amount in a frequency band corresponding to the voice print of a living body when speech is performed, the vibration feeling caused due to skipping in the speech frequency can be suppressed. Also, by reducing the attenuation amount of a filter only when speech is detected, the howling suppression device 100 can sufficiently suppress occurrence of howling in the entire frequency band when speech is not detected.

As described above, the howling suppression device 100 adjusts the attenuation amount of the comb filter 10 in accordance with the frequency of an adjustment band Band($m_a$). In this manner, the howling suppression device 100 of the present example can make speech easy to be heard by reducing the attenuation amount for a frequency band corresponding to the voice print.

Example Embodiment 3

Figure 8:
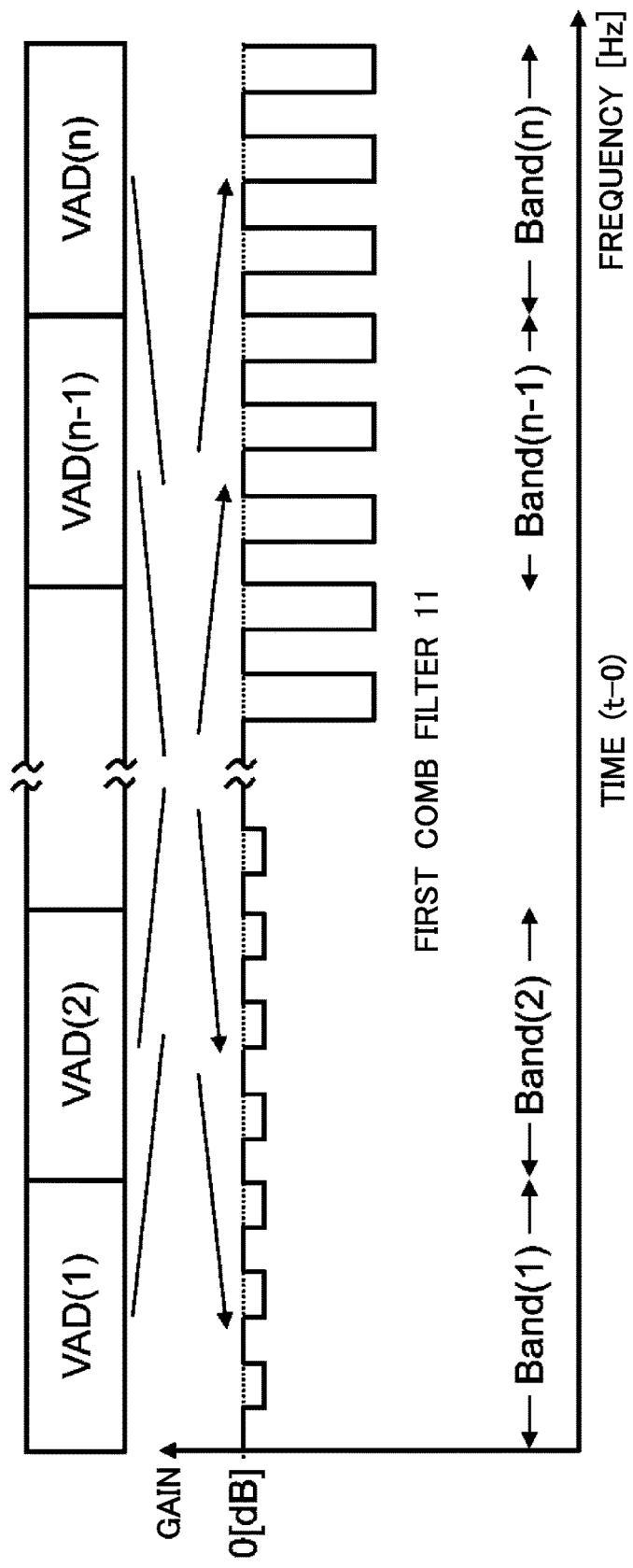
FIG. 8 shows an example of the first comb filter 11 according to an example embodiment 3.

FIG. 8 shows an example of the first comb filter 11 according to an example embodiment 3. The howling suppression device 100 of the present example pairs a detection band Band($m_d$) and an adjustment band Band($m_a$) that are different from each other. That is, the howling suppression device 100 reduces the attenuation amount for a frequency band different from a frequency band in which the voice activity detector 30 detected speech.

The voice activity detector 30 of the present example pairs, in a cross-coupled manner, a detection band Band($m_d$) and an adjustment band Band($m_a$) represented by the following formula:

$$\text{Band}\left(\frac{n}{2} + m_d\right), \text{ if } 1 \le m_d \le \frac{n}{2}$$
$$\text{Band}\left(-\frac{n}{2} + m_d\right), \text{ if } \frac{n}{2} < m_d \le n.$$

For example, the $m_d$-th ($m_d$ is an integer of 1 or more and n or less) voice activity detector on the frequency axis, VAD($m_d$), detects speech in the $m_d$-th detection band on the frequency axis, Band($m_d$), and adjusts the attenuation amount for the $m_a$-th ($m_a$ is an integer of 1 or more and n or less) adjustment band on the frequency axis, Band($m_a$).

More specifically, the voice activity detector VAD(1) determines whether speech occurs or not from temporal variation in the amplitude of sound for a frequency component included in Band(1). When speech is detected, the voice activity detector VAD(1) adjusts the attenuation amount for Band(n) separated from Band(1). However, Band(n) is different from the frequency band of the voice print, and therefore the voice activity detector VAD(1) does not reduce the attenuation amount for Band(n). Similarly, the voice activity detector VAD(2) determines whether speech occurs or not from temporal variation in the amplitude of sound for a frequency component included in Band(2). When speech is detected, the voice activity detector VAD(2) adjusts the attenuation amount for Band(n−1). However, Band(n−1) is different from the frequency band of the voice print, and therefore the voice activity detector VAD(2) does not reduce the attenuation amount for Band(n−1).

On the other hand, the voice activity detector VAD(n) determines whether speech occurs or not from temporal variation in the amplitude of sound for a frequency component included in Band(n). When speech is detected, the voice activity detector VAD(n) adjusts the attenuation amount for Band(1) separated from Band(n). Here, Band(1) is a frequency band corresponding to the voice print, and therefore the voice activity detector VAD(n) reduces the attenuation amount for Band(1). Similarly, the voice activity detector VAD(n−1) determines whether speech occurs or not from temporal variation in the amplitude of sound for a frequency component included in Band(n−1). When speech is detected, the voice activity detector VAD(n−1) adjusts the attenuation amount for Band(2) separated from Band(n−1). Here, Band(2) is a frequency band corresponding to the voice print, and therefore the voice activity detector VAD(n−1) reduces the attenuation amount for Band(2).

Figure 9:
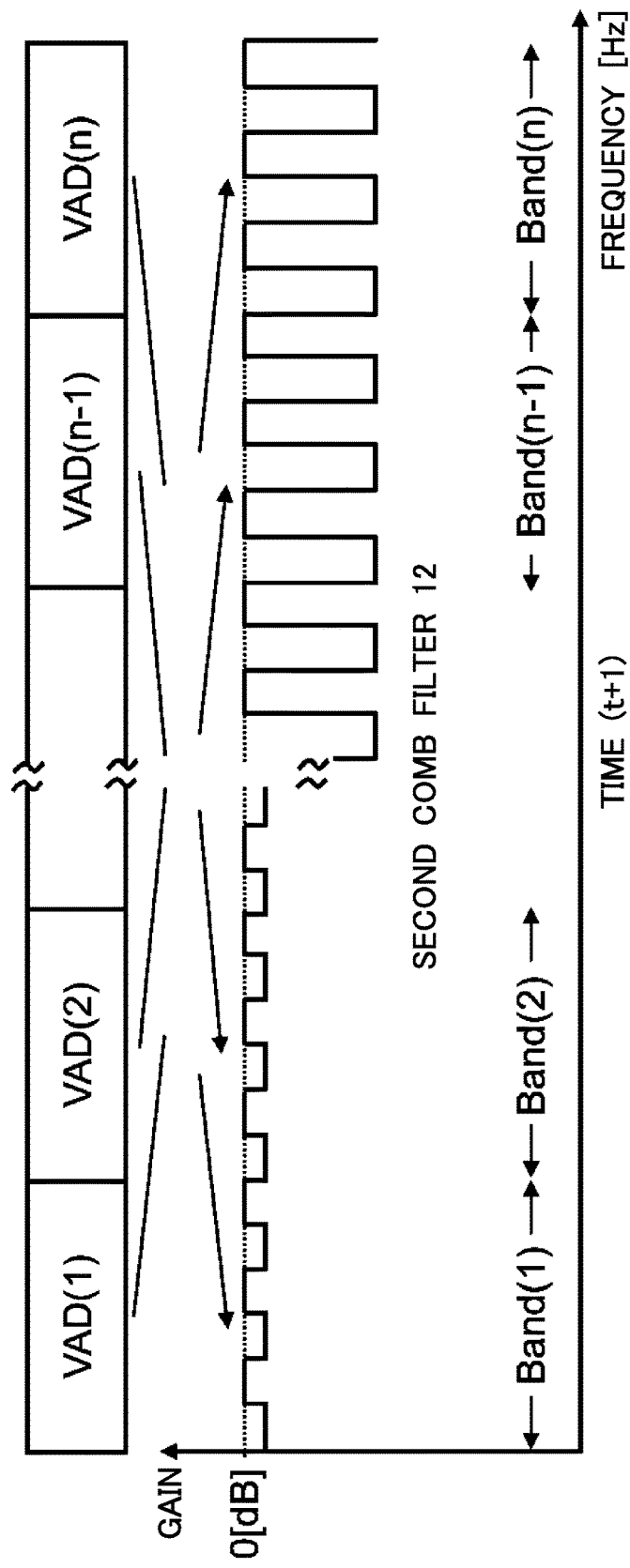
FIG. 9 shows an example of the second comb filter 12 according to the example embodiment 3.

FIG. 9 shows an example of the second comb filter 12 according to the example embodiment 3. The vertical axis indicates gain [dB], and the horizontal axis indicates frequency [Hz]. The present example shows the first comb filter 11 at time (t+1).

The voice activity detector 30 pairs a detection band Band($m_d$) and an adjustment band Band($m_a$) that are frequency bands different from each other, in a manner similar to the first comb filter 11 according to the example embodiment 3. Also, the voice activity detector 30 arranges the passbands and stopbands in a staggered manner such that the first comb filter 11 and the second comb filter 12 mate with each other, in a manner similar to the example embodiments 1 and 2.

The voice activity detector 30 of the present example pairs a detection band Band($m_d$) and an adjustment band Band($m_a$), in a manner similar to adjusting the first comb filter 11. However, the voice activity detector 30 may perform detection of speech and adjustment of an attenuation amount using different pairing from the first comb filter 11.

Here, speech and howling are both non-stationary signals, and therefore, when howling occurs, the attenuation amount of the comb filter 10 may be reduced by mistaking it for speech. Also, if any voice activity detector VAD detects speech in its frequency band, the attenuation amount of the comb filter 10 is reduced also when howling occurs. If the attenuation amount of the comb filter 10 is reduced, howling can not be suppressed sufficiently when it occurs.

The howling suppression device 100 of the present example can prevent the malfunction due to howling, by pairing a detection band Band($m_d$) and an adjustment band Band($m_a$) which are spaced apart from each other. Pairing of a detection band Band($m_d$) and an adjustment band Band ($m_a$) which are spaced apart from each other holds under the following two assumptions.

The first assumption is that, when howling occurs in Band($m_1$), howling would not be occurring in the frequency of Band($m_2$) which is far separated from Band($m_1$). Empirically, frequency components where howling occurs are not concentrated in one frequency region, and howling begins to increase at individually discrete frequencies at different times. That is, it can be assumed that howling occurs at particular frequencies and howling does not start to occur simultaneously at different frequencies. More specifically, it is assumed that howling does not begin to occur simultaneously in a high frequency sound (beep) and a low frequency sound (boom). In this case, the high frequency sound (beep) is suppressed with a "normal" lower VAD signal when the low frequency sound (boom) does not yet begin.

The second assumption is that, when a living body performs speech, the voice activity detector VAD($m_1$) and the voice activity detector VAD($m_2$) would both determine that speech occurs. When a living body performs speech, it is basically considered that the frequency bands corresponding to all the voice activity detectors VAD(1) to VAD(n) are non-stationary, and therefore the voice activity detectors VAD(1) to VAD(n) can each determine that it is speech of the living body.

As described above, the voice activity detector 30 of the present example pairs a detection band Band($m_d$) and an adjustment band Band($m_a$) that are frequency bands different from each other. In this manner, the howling suppression device 100 prevents the attenuation amount of the comb filter 10 from being reduced by mistake due to misdetection of speech in occurrence of howling.

Note that the voice activity detector 30 may switch pairing of a detection band Band($m_d$) and an adjustment band Band($m_a$). For example, the voice activity detector 30 switches pairing of a detection band Band($m_d$) and an adjustment band Band($m_a$) at a predetermined period. Also, the voice activity detector 30 may switch to more appropriate pairing in accordance with the external environment of the howling suppression device 100 or the like.

Example Embodiment 4

Figure 10:
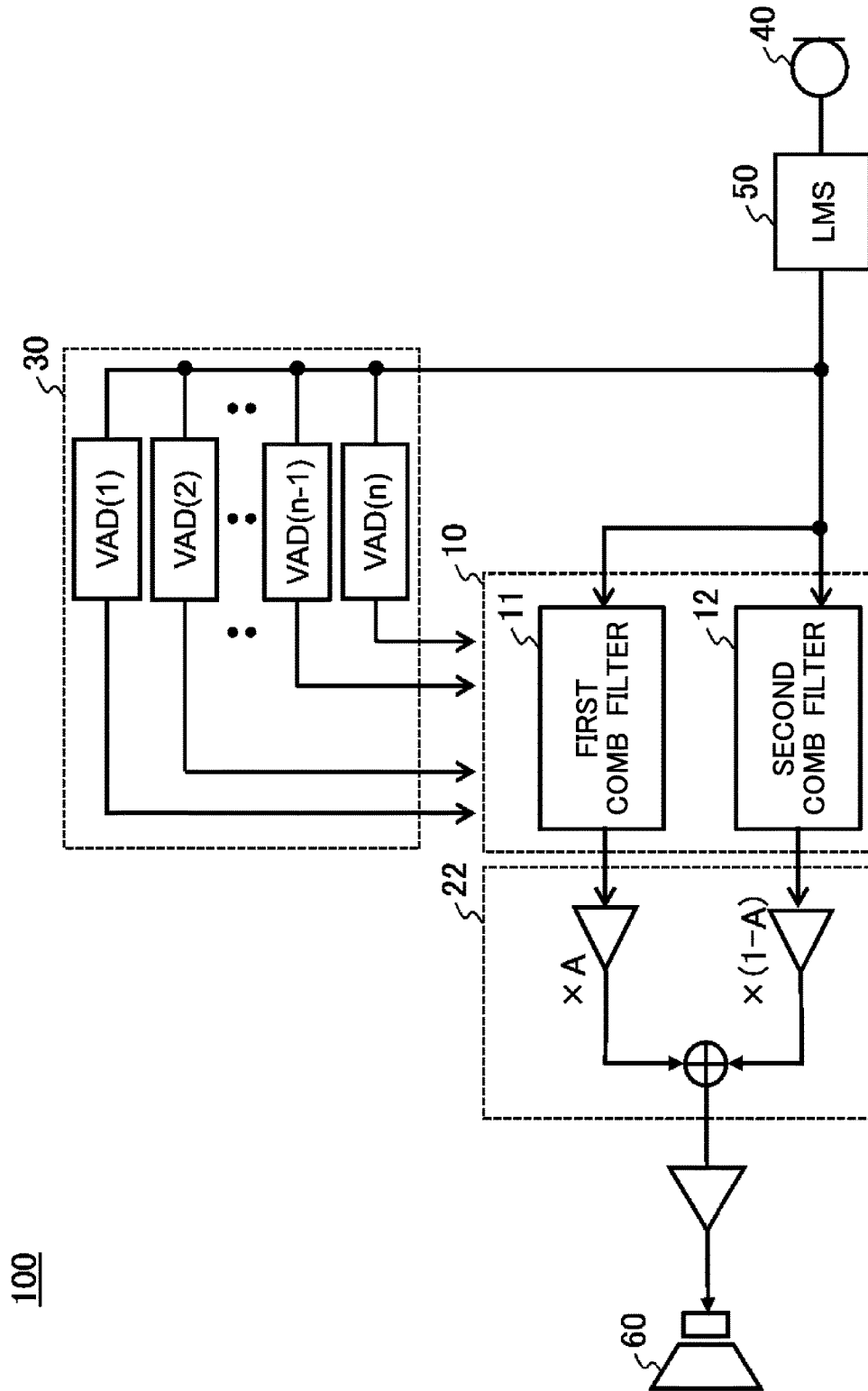
FIG. 10 shows a configuration example of the howling suppression device 100 according to an example embodiment 4.

FIG. 10 shows a configuration example of the howling suppression device 100 according to an example embodiment 4. The gain control unit 20 of the present example is different from the configuration according to the example embodiments 1 to 3 in that it is configured of a variable adder 22 instead of the selector 21.

The variable adder 22 amplifies a sound signal output from the first comb filter 11 and the second comb filter 12 with a predetermined output gain. In other words, the variable adder 22 controls the amplitude of the first comb filter 11 and the second comb filter 12 with a predetermined output gain. For example, the variable adder 22 amplifies the first comb filter 11 with an output gain A and amplifies the second comb filter 12 with an output gain (1-A). Here, the output gain A is set to a value of 0 to 1, and therefore the output gain (1-A) is also set to a value of 0 to 1. Also, the variable adder 22 sums the outputs of the first comb filter 11 and the second comb filter 12. That is, the variable adder 22 operates such that the output gain after summing the outputs of the first comb filter 11 and the second comb filter 12 is always one time.

Figure 11:
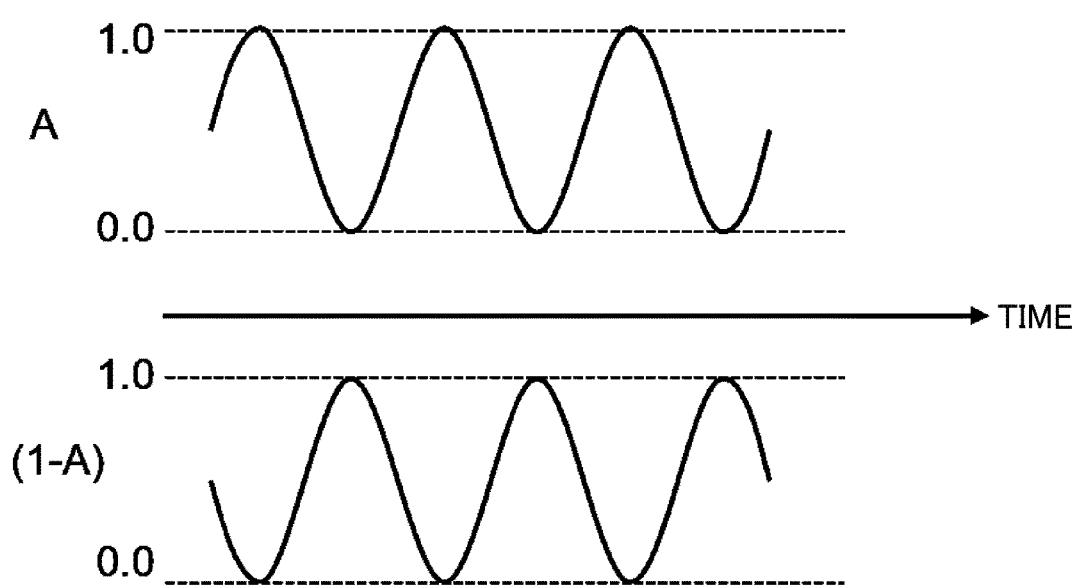
FIG. 11 shows an example of temporal variation in the output gain of a variable adder 22 according to the example embodiment 4.

FIG. 11 shows an example of temporal variation in the output gain of the variable adder 22 according to the example embodiment 4. The variable adder 22 varies the value of the output gain A to form a sine wave in a range of 0 to 1. In this manner, the output gain (1-A) forms a sine wave with different phase from the output gain A. Note that, the variable adder 22 may vary the value of the output gain A to form a rectangular wave or trapezoidal wave, without limiting to a sine wave.

The howling suppression device 100 of the present example is set such that the total of the output gain of the first comb filter 11 and the output gain of the second comb filter 12 is always one, and therefore the sound pressure of a sound signal output from the howling suppression device 100 is substantially constant. In this manner, the howling suppression device 100 can convey a sound signal input to the microphone 40 to the listener without providing an unnatural feeling.

Figure 12:
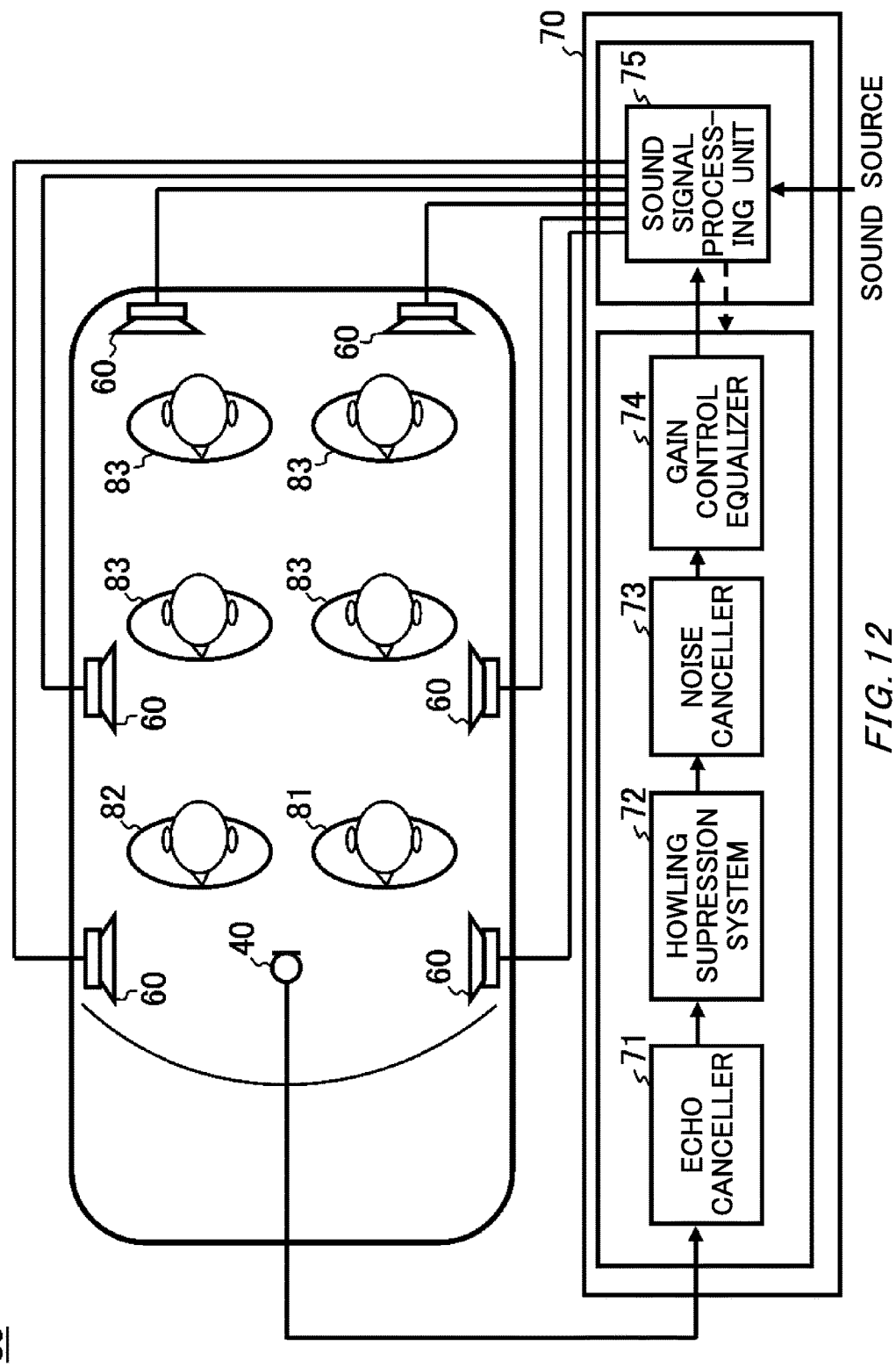
FIG. 12 shows a configuration example of a howling suppression system 200 in a vehicle 80.

FIG. 12 shows a configuration example of a howling suppression system 200 in a vehicle 80. The vehicle 80 includes a transmission device 70, a microphone 40 and a plurality of speakers 60.

The vehicle 80 includes a plurality of rows of seats on which a plurality of occupants are positioned. A driver 81, a co-driver 82 and four occupants 83 ride in the vehicle 80 of the present example. For example, when the driver 81 and a rear occupant 83 have a conversation in such an arrangement of occupants, the speaker's voice that directly reaches the listener may be buried in surrounding noise or the like, making it difficult to continue the conversation. Thus, the vehicle 80 is provided with the transmission device 70 to convey a sound signal detected at the microphone 40 and output it from the speaker 60.

The transmission device 70 operates in an ICC (In Car Communication) mode. The transmission device 70 of the present example includes an echo canceller 71, a howling suppression system 72, a noise canceller 73, a gain control equalizer 74 and a sound signal processing unit 75. The echo canceller 71, the noise canceller 73, the gain control equalizer 74 and the sound signal processing unit 75 may be typical circuits to perform echo cancellation, noise removal, sound level adjustment and the like.

Here, in order to suppress howling, it is necessary to weaken acoustic coupling of the acoustically closed circuit. In order to weaken the acoustic coupling, it is preferable that amplification of a sound signal is little and the distance between the microphone 40 and the speaker 60 is sufficiently long.

However, it is difficult for the transmission device 70 in the vehicle 80 to reduce the gain for a sound signal input to the microphone 40. That is, it is necessary to take a distance of around 50 cm to 1 m between the microphone 40 and the speaker in the vehicle 80 to eliminate trouble in driving, so that the speaker's voice picked up by the microphone 40 is attenuated. For that reason, it is necessary for the transmission device 70 to amplify a sound signal with a large gain. Besides, it is necessary to set the amplifier with a large gain in order to make a sound emitted from the speaker 60 louder than high noise in the vehicle 80 which occurs while driving.

Also, for the transmission device 70, it is difficult to take a sufficient distance between the microphone 40 and the speaker 60 in a limited space of the vehicle 80. As a result, a highly strong acoustic coupling may occur in the system in the vehicle 80, causing a loud howling which is amplified at many frequencies and also in a short time.

Thus, the howling suppression system 72 is required to suppress howling in the vehicle 80 which occurs at many frequencies and in a short time. The howling suppression system 72 of the present example includes the howling suppression device 100 disclosed in the example embodiments 1 to 4. In this manner, the howling suppression system 72 suppresses howling in a frequency band where howling may occur, before howling occurs. That is, according to the howling suppression system 72, it is not necessary to detect howling in advance as is conventionally done, and therefore howling can be suppressed at the same time as or before occurrence of the howling. Also, it is not necessary to estimate the natural frequency of howling, and therefore the howling suppression system 72 exhibits an excellent effect of suppressing howling in the vehicle 80 where the natural frequency of howling varies significantly in accordance with the number of occupants to ride, the condition of luggage to load and the like.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A howling suppression device comprising:
  a plurality of filters in which a passband and a stopband are arranged alternately on a frequency axis, including a first comb filter in which a passband and a stopband are arranged alternately on a frequency axis and a second comb filter in which a passband is arranged in a frequency band that is different from that of the passband of the first comb filter;
  a gain control unit which temporally varies an output gain of each of the plurality of filters and sums signals thus varied to output; and
  a sound detector which detects a sound signal in each of at least one detection band, each detection band being a divided predetermined frequency band in which sound is detected, wherein
  each of the plurality of filters has a passband in at least part of a stopband of another filter,
  the gain control unit temporally varies a first output gain of the first comb filter and a second output gain of the second comb filter, and
  the sound detector pairs each detection band with an adjustment band in one-to-one correspondence among the divided predetermined frequency bands and adjusts attenuation amounts of the first comb filter and the second comb filter in an adjustment band that corresponds to the paired detection band, based on the sound signal detected in the paired detection band.

2. The howling suppression device according to claim 1, wherein
  the passband of the first comb filter is a frequency band equal to a stopband of the second comb filter, and the stopband of the first comb filter is a frequency band equal to the passband of the second comb filter.

3. The howling suppression device according to claim 2, wherein the gain control unit temporally varies the first output gain and the second output gain at a period of 2 ms or more and 100 ms or less.

4. The howling suppression device according to claim 1, wherein the sound detector pairs the detection band and the adjustment band which are different from each other.

5. The howling suppression device according to claim 4, wherein the sound detector includes n (n is a multiple of 2) sound detectors which respectively correspond to n frequency bands, and pairs, in a cross-coupled manner, the detection band corresponding to a $m_d$-th ($m_d$ is an integer of 1 or more and n or less) frequency band, Band($m_d$), and the adjustment band corresponding to a frequency band represented by the following formula:

$$\text{Band}\left(\frac{n}{2} + m_d\right), \text{ if } 1 \leq m_d \leq \frac{n}{2}$$
$$\text{Band}\left(-\frac{n}{2} + m_d\right), \text{ if } \frac{n}{2} < m_d \leq n.$$

6. The howling suppression device according to claim 1, wherein the sound detector changes pairing of the detection band and the adjustment band.

7. The howling suppression device according to claim 1, wherein the sound detector changes widths of the detection band and the adjustment band.

8. The howling suppression device according to claim 1, wherein
the sound signal is a signal based on speech of a living body, and
when speech of the living body is detected, the sound detector reduces attenuation amounts of the first comb filter and the second comb filter in the adjustment band in a frequency band corresponding to a voice print of the living body.

9. The howling suppression device according to claim 1, wherein the gain control unit varies the first output gain and the second output gain in response to the sound detector detecting the sound signal.

10. The howling suppression device according to claim 9, wherein the sound detector increases the first output gain and the second output gain in response to detecting that the adjustment band that corresponds to the paired detection band further corresponds to a voice print.

11. The howling suppression device according to claim 10, wherein
the sound detector includes n sound detectors, which respectively correspond to n frequency bands, and pairs, in a cross-coupled manner, the detection band corresponding to an $m_d$-th frequency band, Band($m_d$), with the adjustment band corresponding to a frequency band represented by the following formula:

$$\text{Band}\left(\frac{n}{2} + m_d\right), \text{ if } 1 \leq m_d \leq \frac{n}{2}$$
$$\text{Band}\left(-\frac{n}{2} + m_d\right), \text{ if } \frac{n}{2} < m_d \leq n,$$

n is a multiple of 2, and
$m_d$ is an integer of 1 or more and n or less.

12. The howling suppression device according to claim 1, wherein the sound detector includes a plurality of sound detectors, each of which corresponds to a divided predetermined frequency band.

13. A howling suppression device comprising:
a plurality of filters in which a passband and a stopband are arranged alternately on a frequency axis, including a first comb filter in which a passband and a stopband are arranged alternately on a frequency axis and a second comb filter in which a passband is arranged in a frequency band that is different from that of the passband of the first comb filter; and
a gain control unit which temporally varies an output gain of each of the plurality of filters and sums signals thus varied to output;
wherein
each of the plurality of filters has a passband in at least part of a stopband of another filter, and
the gain control unit alternately switches a first state in which a first output gain of the first comb filter is set to 1 and a second output gain of the second comb filter is set to 0 and a second state in which the first output gain is set to 0 and the second output gain is set to 1.

14. A howling suppression device comprising:
a plurality of filters in which a passband and a stopband are arranged alternately on a frequency axis, including a first comb filter in which a passband and a stopband are arranged alternately on a frequency axis and a second comb filter in which a passband is arranged in a frequency band that is different from that of the passband of the first comb filter; and
a gain control unit which temporally varies an output gain of each of the plurality of filters and sums signals thus varied to output;
wherein
each of the plurality of filters has a passband in at least part of a stopband of another filter, and
wherein the gain control unit temporally varies a first output gain of the first comb filter and a second output gain of the second comb filter such that a total of the first output gain and the second output gain is 1.

15. The howling suppression device according to claim 14, wherein the gain control unit controls the first output gain and the second output gain to form a sine wave, rectangular wave or trapezoidal wave.

16. A howling suppression device comprising:
a plurality of filters in which a passband and a stopband are arranged alternately on a frequency axis, including a first comb filter in which a passband and a stopband are arranged alternately on a frequency axis and a second comb filter in which a passband is arranged in a frequency band that is different from that of the passband of the first comb filter; and
a gain control unit which temporally varies an output gain of each of the plurality of filters and sums signals thus varied to output;
wherein
each of the plurality of filters has a passband in at least part of a stopband of another filter, and
the gain control unit temporally varies a first output gain of the first comb filter and a second output gain of the second comb filter at a period of 2 ms or more and 100 ms or less.

* * * * *